(12) United States Patent
Ishikawa (10) Patent No.: US 10,014,159 B2
(45) Date of Patent: Jul. 3, 2018

(54) DETECTOR APPARATUS AND CHARGED PARTICLE BEAM SYSTEM

(71) Applicant: JEOL Ltd., Tokyo (JP)

(72) Inventor: Takaki Ishikawa, Tokyo (JP)

(73) Assignee: JEOL Ltd. (JP)

( * ) Notice: Subject to any disclaimer, the term of this patent is extended or adjusted under 35 U.S.C. 154(b) by 0 days.

(21) Appl. No.: 15/331,182

(22) Filed: Oct. 21, 2016

(65) Prior Publication Data

US 2017/0117117 A1    Apr. 27, 2017

(30) Foreign Application Priority Data

Oct. 23, 2015    (JP) .................................. 2015-208732

(51) Int. Cl.
     *H01J 37/20*      (2006.01)
     *H01J 37/244*      (2006.01)
     *H01J 37/26*      (2006.01)

(52) U.S. Cl.
     CPC ............ *H01J 37/244* (2013.01); *H01J 37/20* (2013.01); *H01J 37/26* (2013.01); *H01J 2237/202* (2013.01); *H01J 2237/24578* (2013.01)

(58) Field of Classification Search
     CPC .......... H01J 37/20; H01J 37/244; H01J 37/26; H01J 2237/202; H01J 2237/24578
     See application file for complete search history.

(56) References Cited

U.S. PATENT DOCUMENTS

| | | | | |
|---|---|---|---|---|
| 3,727,051 A | * | 4/1973 | Page | H01J 37/20 250/311 |
| 5,734,160 A | * | 3/1998 | Chung | B62D 15/02 250/231.13 |
| 2009/0276180 A1 | * | 11/2009 | Schneider | G01B 21/22 702/151 |

FOREIGN PATENT DOCUMENTS

JP      2012138219 A      7/2012

* cited by examiner

*Primary Examiner* — David E Smith
(74) *Attorney, Agent, or Firm* — The Webb Law Firm (57) ABSTRACT

There is provided a detector apparatus capable of detecting the position or tilt angle of a sample stage with high resolution and high reliability. The detector apparatus (100) is operative to detect the position or tilt angle of the sample stage (2), and has a potentiometer (10) for detecting the position or tilt angle of the sample stage (2), an encoder (20) for detecting the position or tilt angle of the sample stage (2), and a computing unit (30) for calculating the position or tilt angle of the sample stage (2), based both on an output signal from the potentiometer (10) and on an output signal from the encoder (20).

3 Claims, 6 Drawing Sheets

Fig.9

DETECTOR APPARATUS AND CHARGED PARTICLE BEAM SYSTEM

CROSS-REFERENCE TO RELATED APPLICATION

This application and claims priority to Japanese Patent Application No. 2015-208732 filed Oct. 23, 2015, the disclosure of which is hereby incorporated in its entirety by reference.

BACKGROUND OF THE INVENTION

1. Field of the Invention

The present invention relates to a detector apparatus and a charged particle beam system.

2. Description of the Related Art

A sample stage for use in an electron microscope can move a sample into a specified position and tilt the sample through a specified angle (see, for example, patent document 1).

When a sample is observed with an electron microscope, the user moves the sample in order either to search for a subject to be observed or to place the sample in the center of the field of view. Furthermore, the user moves the sample in order to correct or adjust the height or tilt angle of the sample.

In electron microscopy, coordinates indicating the position of a sample are displayed on a display screen. The user moves the sample while using as a reference the displayed coordinates indicating the sample position.

Furthermore, in an electron microscope, a control system for a sample stage controls the sample stage, also based on the coordinates indicative of the position of a sample. In addition, where image analysis software for reconstructing a three-dimensional image of a sample tomographically is used, the tilt angle of the sample is used as a parameter in analyzing the image or structure.

In this way, in an electron microscope, information about the position and tilt angle of a sample is used in various situations. Accordingly, there is a demand for a detector apparatus capable of detecting the position and tilt angle of a sample stage with high resolution and also with high reliability.

CITATION LIST

Patent Documents

Patent document 1: JP-A-2012-138219

SUMMARY OF THE INVENTION

One object associated with some aspects of the present invention is to provide a detector apparatus capable of detecting the position or tilt angle of a sample stage with high resolution and high reliability. Another object associated with some aspects of the invention is to provide a charged particle beam system including this detector apparatus.

(1) A detector apparatus associated with the present invention has: a potentiometer for detecting the position or tilt angle of a sample stage; an encoder having higher resolution than the potentiometer and operative to detect the position or tilt angle of the sample stage; and a computing unit for calculating the position or tilt angle of the sample stage, based both on an output signal from the potentiometer and on an output signal from the encoder.

In this detector apparatus, the computing unit calculates the position or tilt angle of the sample stage, based both an output signal from the potentiometer and on an output signal from the encoder. Therefore, the position or tilt angle of the sample stage can be detected with high resolution and with high reliability.

(2) In one feature of this detector apparatus of (1) above, the output signal from the potentiometer may vary according to the position or tilt angle of the sample stage. If the output signal from the potentiometer varies, the computing unit may calculate the position or tilt angle of the sample stage, based on the output signal from the potentiometer. If the output signal from the potentiometer does not vary, the computing unit may calculate the position or tilt angle of the sample stage by adding an amount of movement or tilt of the sample stage calculated based on the output signal from the encoder to the position or tilt angle of the sample stage calculated based on the output signal from the potentiometer.

In this detector apparatus, the tilt angle of the sample stage computed based on the encoder having high resolution can be corrected by the potentiometer that can detect the absolute tilt angle with high reliability and so the position or tilt angle of the sample stage can be detected with high resolution and also with high reliability.

(3) In one feature of the detector apparatus of (1) or (2), the sample stage may be for use in a charged particle beam system.

In this detector apparatus, the position or tilt angle of the sample stage in a charged particle beam system can be detected with high resolution and with high reliability.

(4) A charged particle beam system associated with the present invention includes a detector apparatus associated with the present invention.

In this charged particle beam system, the position or tilt angle of a sample stage can be detected with high resolution and also with high reliability. Consequently, this charged particle beam system can move or tilt the sample stage accurately.

DETAILED DESCRIPTION OF THE INVENTION

The preferred embodiments of the present invention are hereinafter described in detail with reference to the drawings. It is to be understood that the embodiments described below are not intended to unduly restrict the content of the present invention delineated by the claims and that not all the configurations described below are essential constituent components of the invention.

1. Detector Apparatus

Figure 1:
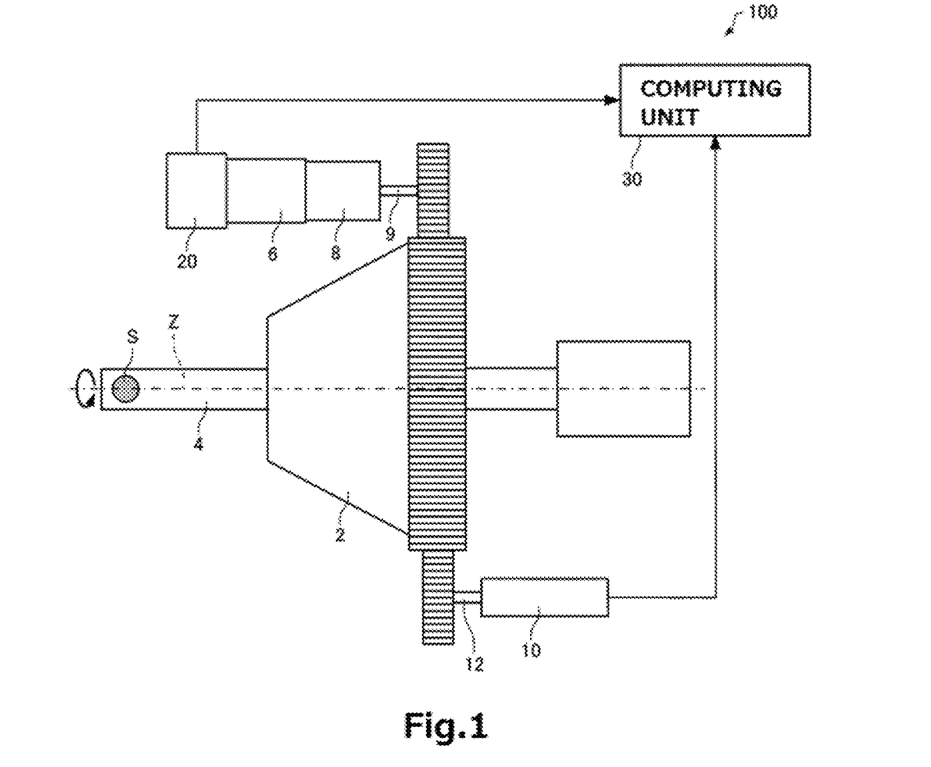
FIG. 1 is a schematic diagram of a detector apparatus associated with one embodiment of the present invention.
Figure 2:
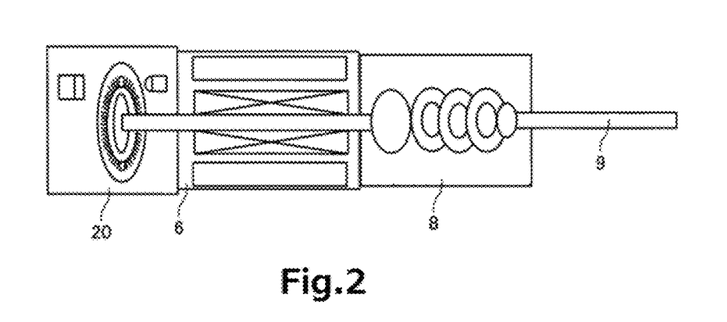
FIG. 2 is a schematic representation of the encoder, motor, and reduction gearing shown in FIG. 1.

A detector apparatus associated with one embodiment of the present invention is first described by referring to FIG. 1, which schematically shows the detector apparatus, and also to FIG. 2, which schematically shows an encoder 20, an electric motor 6, and reduction gearing 8.

The detector apparatus, generally indicated by reference numeral 100, is operative to detect the tilt angle of a sample stage 2, which is an angle made between a surface of the sample stage 2 on which a sample S is placed and a horizontal plane perpendicular to the direction along which gravity acts.

The sample stage 2 is rotated about a Z-axis by being driven by the motor 6. The angle of rotation of the sample stage 2 about the Z-axis corresponds to the angle of tilt of the stage 2. The sample S that is held to the sample stage 2 via a sample holder 4 can be tilted by tilting the stage 2.

The motor 6 functions as a mechanical driver for tilting the sample stage 2. As also shown in FIG. 2, the reduction gearing 8 may be disposed between the motor 6 and the sample stage 2 to reduce the rotational speed of the motor 6. The rotation of the motor 6 is transmitted to the sample stage 2 via a rotary shaft 9 of the reduction gearing 8.

As shown in FIG. 1, the detector apparatus 100 includes a computing unit 30 as well as the aforementioned potentiometer 10 and encoder 20.

The potentiometer 10 detects the tilt angle of the sample stage 2. The potentiometer 10 has a rotary shaft 12 that rotates with rotation of the motor 6. In the illustrated example, the rotation of the motor 6 is transmitted to the rotary shaft 12 via gears of the sample stage 2. The rotation of the rotary shaft 12 varies the internal resistance value of the potentiometer 10. It suffices that the potentiometer 10 be mounted such that its rotary shaft 12 is rotated as the sample stage 2 (motor 6) rotates. No restriction is placed on the location where the potentiometer 10 is mounted.

The potentiometer 10 produces an output signal that is analog-to-digital converted by the computing unit 30 into a digital value corresponding to the internal resistance value of the potentiometer 10. The computing unit 30 calculates the tilt angle of the sample stage 2 from the digital value. The computing unit 30 monitors the internal resistance value of the potentiometer 10 in response to the output signal from the potentiometer 10 and computes the tilt angle of the sample stage 2.

Figure 3:
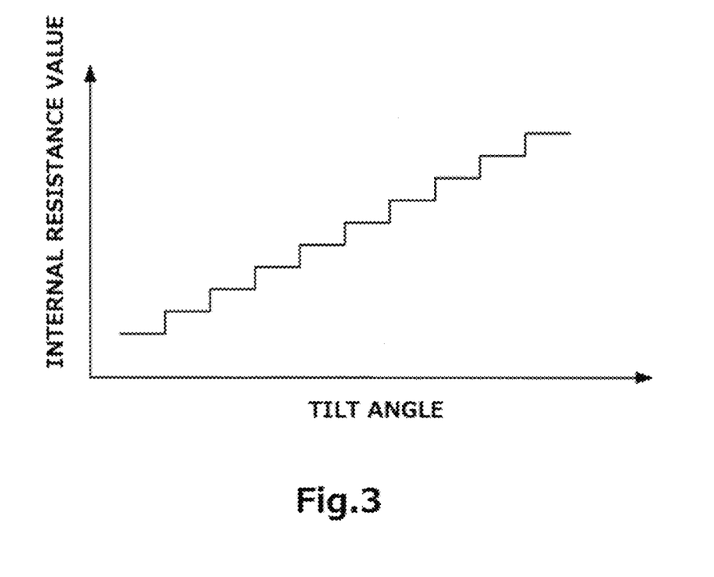
FIG. 3 is a graph showing one example of the relationship between the internal resistance value of the potentiometer shown in FIG. 1 and the tilt angle of the sample stage also shown in FIG. 1.

FIG. 3 is a graph showing one example of the relationship between the internal resistance value of the potentiometer 10 and the tilt angle of the sample stage 2. In the graph of FIG. 3, the horizontal axis indicates the tilt angle of the sample stage 2, while the vertical axis indicates the digital value of the internal resistance of the potentiometer 10.

As shown in FIG. 3, the output signal from the potentiometer 10 indicative of its internal resistance value varies according to the tilt angle of the sample stage 2. The internal resistance value of the potentiometer 10 can be made to correspond to the tilt angle of the sample stage 2 in a one-to-one relationship. Therefore, the tilt angle of the sample stage 2 can be calculated from the internal resistance value of the potentiometer 10.

The encoder 20 detects the tilt angle of the sample stage 2. The encoder 20 is formed integrally with the motor 6, and produces an output signal in the form of pulses the number of which corresponds to the rotational speed of the motor 6. It suffices that the encoder 20 be mounted so as to be capable of detecting the rotation of the motor 6. No restriction is imposed on the location where the encoder 20 is mounted.

The output signal in the form of pulses from the encoder 20 is sent to the computing unit 30. The computing unit 30 counts and accumulates the number of pulses delivered from the encoder 20 to thereby calculate the rotational speed of the motor 6 and the tilt angle of the sample stage 2.

The resolutions of the potentiometer 10 and encoder 20 are described now. For example, where the amount of rotation of the potentiometer 10 is limited to 10 revolutions and the output signal from the potentiometer 10 is analog-to-digital converted with a resolution of 12 bits, i.e., the analog input is encoded to one in 4,096 different levels, one revolution of the potentiometer 10 can be divided by 409.6. That is, the potentiometer 10 can provide a resolution of 409.6 levels per revolution.

On the other hand, the encoder 20 can divide one revolution of the motor 6 into 1,000 angular increments, for example. The reduction gearing 8 is connected to the motor 6. Assuming that the gear reduction ratio of the reduction gearing 8 is 1:100, the encoder 20 provides a resolution of 100,000 angular increments per revolution of the rotary shaft 9 of the reduction gearing 8. That is, if the encoder 20 and the rotary shaft 9 of the reduction gearing 8 are coupled together at a ratio of 1:1, it follows that the resolution of the encoder 20 is higher than that of the potentiometer 10 by a factor of as much as about 244 (100,000/409.6) times. Furthermore, the encoder 20 has the advantage that no restriction is placed on the rotational speed unlike the potentiometer 10.

If the range of the tilt angle of the sample stage 2 is from +90 degrees to −90 degrees, the resolution of the potentiometer 10 is approximately 0.044° (180°/4,096) in the above example. On the other hand, the resolution of the encoder 20 is 244 times the resolution of the potentiometer 10 in the above example and, therefore, is approximately 0.00018° (0.044°/244). In this way, the encoder 20 can have higher resolution than the potentiometer 10.

Alternatively, the output signal from the potentiometer 10 may be analog-to-digital converted at a resolution of 10 bits or 8 bits. In this case, the resolution is lowered as compared with the case where the output signal from the potentiometer 10 is analog-to-digital converted at a resolution of 12 bits, but the A/D conversion can be performed more stably.

The reliability with which the potentiometer 10 and the encoder 20 perform detection is next described. As described previously, the potentiometer 10 detects the tilt angle of the sample stage 2 from a variation in the internal resistance value caused by rotation of the rotary shaft 12 in conjunction with the rotation of the sample stage 2. Since the internal resistance value of the potentiometer 10 corresponds to the tilt angle of the sample stage 2 in a one-to-one relationship, the absolute tilt angle can be detected with high reliability.

On the other hand, as noted above, the encoder 20 detects the tilt angle of the sample stage 2 by counting the number of pulses of the signal corresponding to the rotational speed of the motor 6. That is, in the encoder 20, the tilt angle of the sample stage 2 is detected in a relative manner while using the number of pulses of the signal as the amount of tilt from the tilt angle that provides a basis. Therefore, the encoder 20 cannot detect the absolute tilt angle with high reliability unlike the potentiometer 10 because the number of pulses of the signal may not be counted precisely due to introduction of noises and failure to read some pulses. In this way, the potentiometer 10 can perform detection with higher reliability than the encoder 20.

The computing unit 30 calculates the tilt angle of the sample stage 2, based both on the output signal from the potentiometer 10 and on the output signal from the encoder 20. The functions of the computing unit 30 may be implemented either by executing computer programs by means of a processor (such as a CPU or a DSP) or using dedicated circuitry such as an ASIC (e.g., a gate array).

Figure 4:
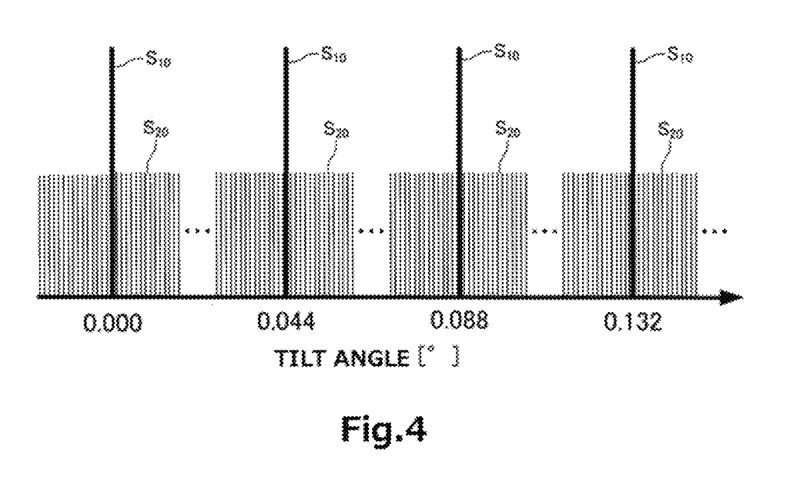
FIG. 4 is a diagram illustrating a processing step of the computing unit of the detector apparatus of FIG. 1 to calculate the tilt angle of the sample stage.

FIG. 4 is a diagram illustrating a processing subroutine performed by the computing unit 30 of the detector apparatus 100 to calculate the tilt angle of the sample stage 2. In FIG. 4, a signal $S_{10}$ in the form of successive pulses indicates timings at which the output signal from the potentiometer 10 indicating its internal resistance varies. FIG. 4 shows a case in which the internal resistance value of the potentiometer 10 varies whenever the sample stage 2 tilts by 0.044° and the encoder 20 produces one pulse $S_{20}$ whenever the sample stage 2 tilts by 0.00018°, in the same manner as in the above-described conditions.

When the sample stage 2 tilts, the internal resistance value of the potentiometer 10 varies according to the amount of rotation or tilt of the sample stage 2. In FIG. 4, the intervals between the successive pulses S10 of the signal represent the resolution of the potentiometer 10.

Also, when the sample stage 2 tilts, the encoder 20 generates the pulses of the signal S20 according to the rotational speed of the motor 6. In the example shown in FIG. 4, the encoder 20 produces the signal S20 consisting of 244 pulses during the intervals between the successive pulses of the signal S10.

The computing unit 30 is monitoring the output signal from the potentiometer 10 that indicates its internal resistance value. If the output signal from the potentiometer 10 varies, the computing unit 30 calculates the tilt angle of the sample stage 2, based on the output signal from the potentiometer 10. At this time, the computing unit 30 computes the tilt angle of the sample stage 2 only from the output signal from the potentiometer 10 and does not refer to the output signal from the encoder 20.

The computing unit 30 calculates the tilt angle of the sample stage 2 by adding the amount of tilt of the stage 2 computed based on the output signal from the encoder 20 to the tilt angle of the stage 2 computed based on the output signal from the potentiometer 10 until the next change of the output signal from the potentiometer 10, i.e., during the interval between successive pulses of the signal S10.

For example, after the tilt angle of the sample stage 2 is calculated to be 0.044°, based on the output signal from the potentiometer 10, the computing unit 30 counts the pulses of the signal S20 from the encoder 20 and calculates the tilt angle of the sample stage 2. For instance, if the counted number of the pulses of the signal S20 from the encoder 20 is "10", the amount of tilt of the sample stage 2 is 0.0018° (0.00018°×10). The tilt angle of the stage 2 is calculated to be 0.0458° (0.044°+0.0018°). If the sample stage 2 is tilted further to thereby vary the output signal from the potentiometer 10, the computing unit 30 calculates the tilt angle of the sample stage 2 to be 0.088°, based on the output signal from the potentiometer 10.

Figure 5:
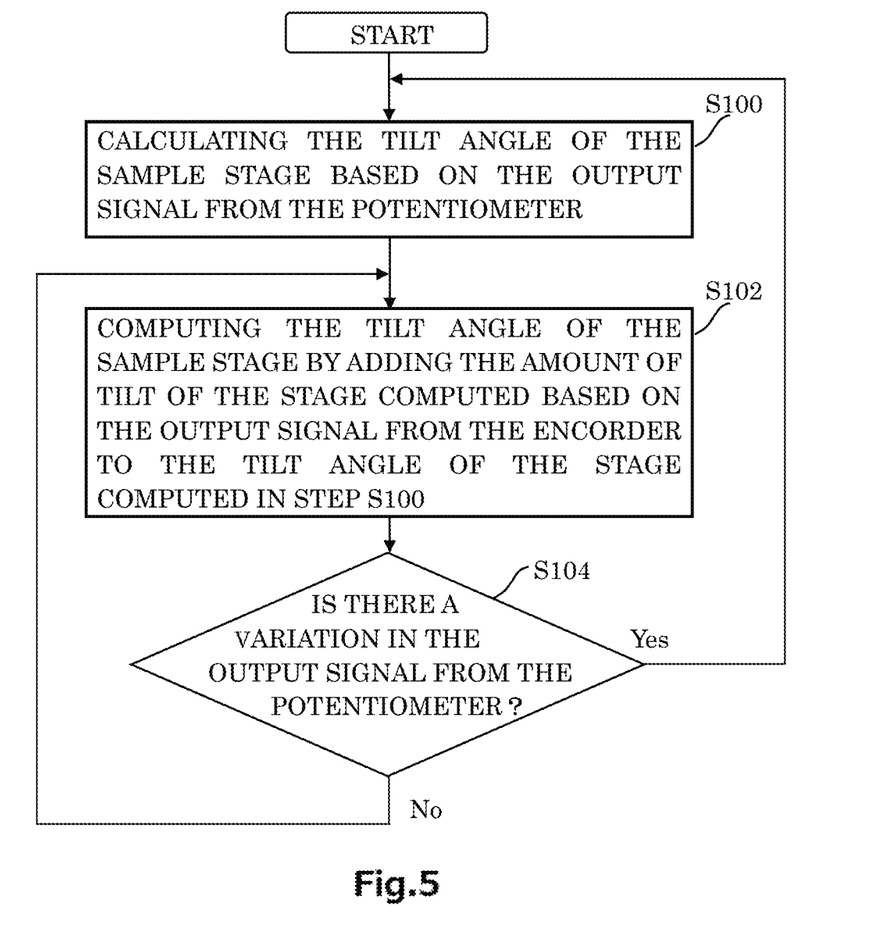
FIG. 5 is a flowchart illustrating one example of subroutine performed by the computing unit of the detector apparatus of FIG. 1.

FIG. 5 is a flowchart illustrating one example of processing subroutine performed by the computing unit 30 of the detector apparatus 100.

First, the computing unit 30 calculates the tilt angle of the sample stage 2, based on the output signal from the potentiometer 10 (step S100).

The computing unit 30 digitizes the output signal from the potentiometer 10, for example, by analog-to-digital converting the signal, and calculates the tilt angle of the sample stage 2 from the resulting digital values using a previously prepared conversion coefficient. The conversion coefficient can be found, for example, from the graph of FIG. 3. The computing unit 30 outputs information about the calculated tilt angle of the sample stage 2 to a display unit (not shown), an external system (not shown), and other device. In consequence, the current tilt angle of the sample stage 2 is displayed on the display unit.

Then, the computing unit 30 computes the tilt angle of the sample stage 2 by adding the amount of tilt of the stage 2 computed based on the output signal from the encoder 20 to the tilt angle of the stage 2 computed in step S100 (step S102).

The computing unit 30 receives the output signal in the form of pulses from the encoder 20 and counts the number of the pulses delivered from the encoder 20. Furthermore, the computing unit 30 calculates the amount of tilt of the sample stage 2 (i.e., the amount of variation from the tilt angle of the sample stage 2 computed in step S100) from the number of the pulses using the previously prepared conversion coefficient. Then, the computing unit 30 calculates the tilt angle of the sample stage 2 assumed after it has tilted by adding the calculated amount of tilt of the stage 2 to the tilt angle of the stage 2 computed in step S100.

The computing unit 30 outputs information about the calculated tilt angle of the sample stage 2 to the display unit and to the external system. Consequently, the current tilt angle of the sample stage 2 is displayed on the display unit.

The computing unit 30 monitors the output signal from the potentiometer 10 indicative of its internal resistance value and detects variations in the output signal from the potentiometer 10, i.e., determines whether there is a variation in the output signal from the potentiometer (step S104).

If the decision at step S104 is negative (No), indicating that there is no variation in the output signal from the potentiometer 10 but the signal remains constant, the computing unit 30 returns to step S102, where the computing unit 30 performs a processing step to calculate the tilt angle of the sample stage 2 by adding the amount of tilt computed based on the output signal from the encoder 20 to the tilt angle of the stage 2 computed in step S100.

If the decision at step S104 is affirmative (Yes), indicating that there is a variation in the output signal from the potentiometer 10, the computing unit 30 goes back to step S100, where the computing unit 30 calculates the tilt angle of the sample stage 2, based only on the output signal from the potentiometer 10.

The computing unit 30 repeatedly carries out the above-described processing sequence of steps S100, S102, and S104.

The detector apparatus 100 has the following features. In the detector apparatus 100, the computing unit 30 calculates the tilt angle of the sample stage 2, based both on the output signal from the potentiometer 10 and on the output signal from the encoder 20. As described previously, the potentiometer 10 can detect the absolute tilt angle of the sample stage 2 with high reliability. Furthermore, the encoder 20 can detect the tilt angle of the sample stage 2 with high resolution. Accordingly, the detector apparatus 100 can detect the tilt angle of the sample stage 2 with high resolution and also with high reliability.

Furthermore, in the detector apparatus 100, the potentiometer 10 can detect the absolute tilt angle with high reliability as described previously. Therefore, if supply of electric power to the apparatus is cut off and information about the current tilt angle of the sample stage 2 is lost, for example, the information about the current tilt angle of the sample stage 2 can be easily obtained on resumption of the power supply.

If there is a variation in the output signal from the potentiometer 10, the detector apparatus 100 calculates the tilt angle of the sample stage 2, based on the output signal from the potentiometer 10. If there is no variation in the output signal from the potentiometer 10, the detector apparatus calculates the tilt angle of the sample stage 2 by adding the amount of tilt of the stage 2 computed based on the output signal from the encoder 20 to the tilt angle of the stage 2 computed based on the output signal from the potentiometer 10. Therefore, in the detector apparatus 100, the tilt angle of the sample stage 2 computed based on the encoder 20 having high resolution can be corrected with the tilt angle computed based on the potentiometer 10 capable of detecting the absolute tilt angle with high reliability. Consequently, the detector apparatus 100 can detect the tilt angle of the sample stage 2 with high resolution and also with high reliability.

2. Charged Particle Beam System

Figure 6:
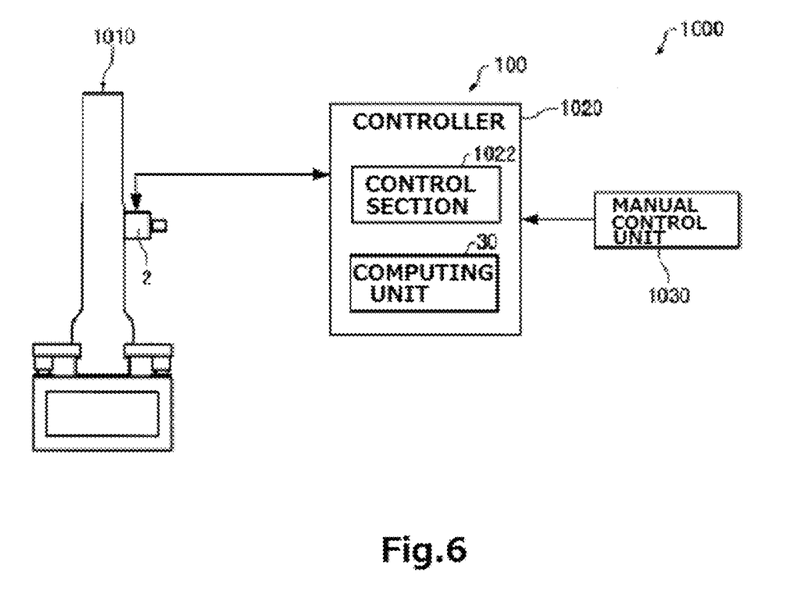
FIG. 6 is a schematic representation of a charged particle beam system associated with another embodiment of the present invention.
Figure 7:
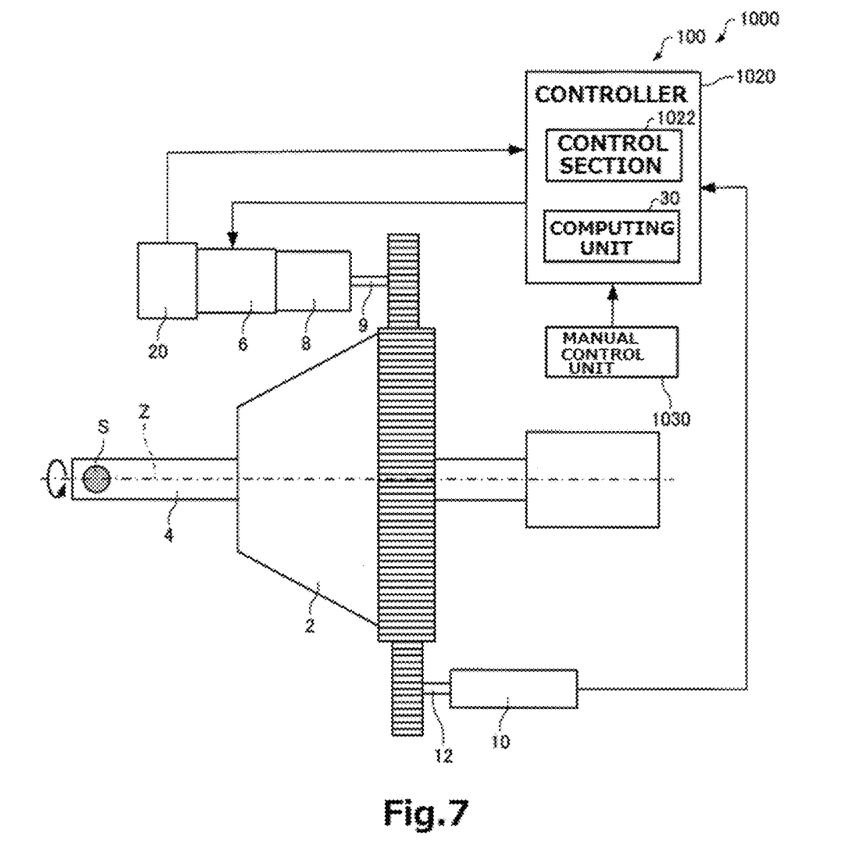
FIG. 7 is a schematic diagram of a sample stage for use in the charged particle beam system of FIG. 6.

A charged particle beam system associated with another embodiment of the present invention is next described by referring to FIGS. 6 and 7. FIG. 6 schematically shows the charged particle beam system, 1000. FIG. 7 schematically shows a sample stage 2 for use in this charged particle beam system 1000.

The charged particle beam system 1000 is a transmission electron microscope (TEM), for example. Note that the charged particle beam system 1000 is not restricted to transmission electron microscopes but rather may be any instrument which irradiates a sample with charged particles (such as electrons or ions) and which permits observation, analysis, machining, and other processing. The charged particle beam system 1000 may also be a scanning electron microscope (SEM), a scanning transmission electron microscope (STEM), a focused ion beam (FIB) system, or the like. An example is given below in which the charged particle beam system 1000 is a transmission electron microscope.

The charged particle beam system 1000 includes the detector apparatus 100 associated with the present invention. An example is now presented in which the charged particle beam system 1000 includes the detector apparatus 100 as a detector apparatus associated with the present invention.

As shown in FIG. 6, the charged particle beam system 1000 whose body portion is indicated by numeral 1010 is configured further including a controller 1020 and a manual control unit 1030.

The body portion 1010 of the charged particle beam system 1000 is configured including a sample stage 2 that holds a sample (not shown). The sample stage 2 may hold the sample via a sample holder 4. The sample stage 2 can move and tilt the sample. The sample stage 2 can place the sample in position.

The body portion 1010 of the charged particle beam system is configured further including an electron beam source for producing an electron beam, an illumination lens system for focusing the beam onto the sample, an imaging lens system for forming a transmission electron microscope (TEM) image (one example of a charged particle beam image) from electrons transmitted through the sample, and an imager for capturing the TEM image in a manner not illustrated.

The controller 1020 is a device for controlling the sample stage 2. The controller 1020 is configured including a control section 1022 and a computing unit 30. The control section 1022 controls the tilt angle of the sample stage 2, based on the tilt angle of the stage 2 computed by the computing unit 30, by operating the motor 6.

The functions of the control section 1022 and computing unit 30 may be implemented by executing computer programs using a processor (such as a CPU or a DSP) or by dedicated circuitry such as an ASIC (e.g., a gate array).

The manual control unit 1030 obtains a control signal responsive to a user's manipulation and sends the signal to the controller 1020. The manual control unit 1030 is made of buttons, keys, a touch panel display, or the like.

Processing performed by the control section 1022 of the controller 1020 is next described. If the user specifies the tilt angle of the sample stage 2 by manipulating the manual control unit 1030, the control section 1022 obtains information relating to the current tilt angle of the sample stage 2 from the computing unit 30. The control section 1022 calculates an amount of tilt to bring the sample stage 2 to a specified tilt angle in response to the obtained information about the current tilt angle of the sample stage 2. The control section 1022 controls the motor 6 to tilt the sample stage 2 from the current tilt angle of the sample stage 2 by the calculated amount of tilt. Consequently, the sample stage 2 can be tilted at the specified tilt angle. A method of calculating the tilt angle of the sample stage 2 by the computing unit 30 has been already described in "1. Detector Apparatus" and so a description thereof is omitted here.

Since the charged particle beam system 1000 includes the detector apparatus 100, the tilt angle of the sample stage 2 can be detected with high resolution and also with high reliability. Therefore, in the charged particle beam system 1000, the sample stage 2 can be tilted with high accuracy.

Furthermore, in the charged particle beam system 1000, the tilt angle of the sample stage 2 can be detected with high resolution and also with high reliability. Therefore, where a three-dimensional image of a sample is reconstructed tomographically, more accurate analysis can be made.

In addition, in the charged particle beam system 1000, the detector apparatus 100 can be used to judge a critical tilt angle at which the sample stage 2 will collide with other member. Consequently, in the charged particle beam system 1000, it is assured that the sample stage 2 is prevented from colliding with any other member.

Further, in the charged particle beam system 1000, information regarding the tilt angle of the sample stage 2 computed by the detector apparatus 100 can be displayed on the display unit (not shown). Therefore, in the charged particle beam system 1000, the user can obtain information about the tilt angle of the sample stage 2 with high resolution and high reliability.

3. Modification

It is to be noted that the present invention is not restricted to the above embodiments and that various modifications are possible without departing from the scope and spirit of the present invention.

As an example, the internal resistance value of the potentiometer 10 varies due to rotation of the rotary shaft 12 as described previously. The linearity between the tilt angle of the sample stage 2 and the internal resistance value may deviate. Therefore, it is desired that the computing unit 30 previously perform processing to obtain information indicating a relationship between the internal resistance value of the potentiometer 10 and the tilt angle of the sample stage 2.

Figure 8:
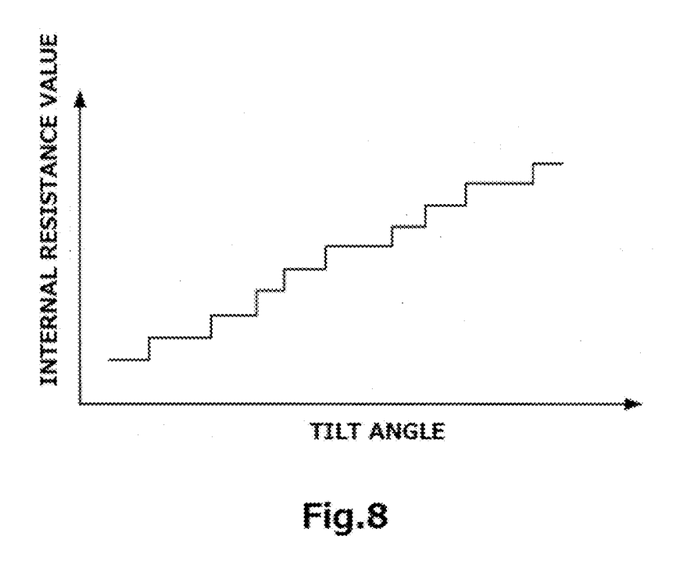
FIG. 8 is a graph showing one example of the relationship between the internal resistance value of the potentiometer of FIG. 7 and the tilt angle of the sample stage of FIG. 7.

FIG. 8 is a graph showing one example of relationship between the internal resistance value of the potentiometer 10 and the tilt angle of the sample stage 2. In the graph of FIG. 8, the horizontal axis indicates the tilt angle of the sample stage 2 measured by a rotation-measuring instrument, while the vertical axis indicates a digital value corresponding to the internal resistance value of the potentiometer 10 obtained by analog-to-digital converting the output signal from the potentiometer 10.

The graph shown in FIG. 8 is obtained by rotating the sample stage 2 in practice and measuring the tilt angle of the stage 2 which corresponds to the digital value of the internal resistance of the potentiometer 10. The tilt angle of the sample stage 2 is measured, for example, with a rotation-measuring instrument capable of accurately measuring the tilt angle (amount of rotation) of the sample stage 2. One example of such a rotation-measuring instrument is an encoder.

Figure 9:
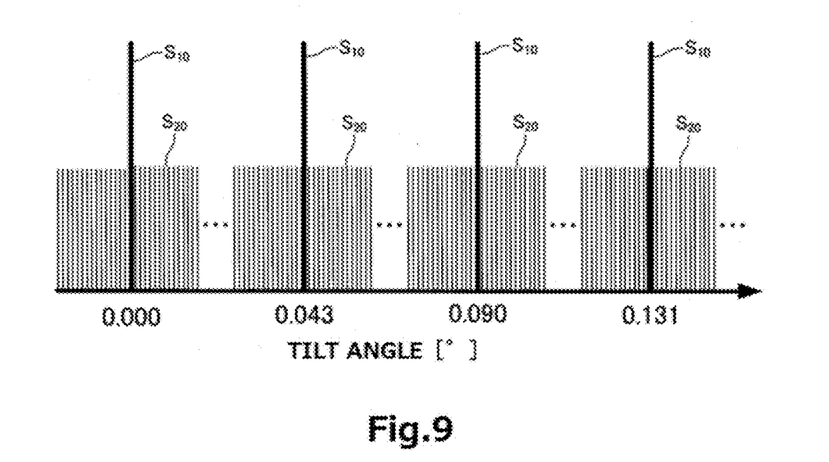
FIG. 9 is a diagram illustrating a processing step performed by a computing unit of a detector apparatus associated with one modification of the embodiment of FIG. 1 to calculate the tilt angle of the sample stage.

FIG. 9 is a diagram illustrating one example of the processing performed by the computing unit 30 of the detector apparatus associated with the present modification to calculate the tilt angle of the sample stage 2.

An an example, prior to the execution of step S100 illustrated in FIG. 5, the computing unit 30 operates to obtain information indicating a relationship between the internal resistance value of the potentiometer 10 and the tilt angle of the sample stage 2. In step S100 illustrated in FIG. 5, the computing unit 30 calculates the tilt angle of the sample stage 2 from a digital value corresponding to the internal resistance value of the potentiometer 10, based on the information (see FIG. 9). Consequently, the tilt angle of the sample stage 2 can be computed more accurately.

In the above-described embodiments, an example has been given in which the detector apparatus 100 calculates the tilt angle of the sample stage 2. The detector apparatus associated with the present invention can be similarly applied to cases where the position of the sample stage 2 is detected.

Where the charged particle beam system is an electron microscope, for example, the position of the sample stage 2 is a two-dimensional position within a horizontal plane perpendicular to the direction along which an electron beam is directed at the sample. In this case, the motor 6 functions as a mechanical drive for moving the sample stage 2 in a horizontal direction. Furthermore, the potentiometer 10 and the encoder 20 detect the position of the sample stage 2.

The computing unit 30 calculates the position of the sample stage 2, based both on the output signal from the potentiometer 10 and on the output signal from the encoder 20. When the output signal from the potentiometer 10 varies, the computing unit 30 calculates the position of the sample stage 2, based on the output signal from the potentiometer 10. When the output signal from the potentiometer 10 does not vary, the computing unit calculates the position of the sample stage 2 by adding the amount of movement of the sample stage 2 computed based on the output signal from the encoder 20 to the position of the stage 2 computed based on the output signal from the potentiometer 10. The processing performed by the computing unit 30 to calculate the position of the sample stage 2 on the basis both of the output signal from the potentiometer 10 and of the output signal from the encoder 20 is similar in detail to the above-described processing for finding the tilt angle of the sample stage 2 and so a description thereof is omitted.

In this detector apparatus, the potentiometer 10 can detect the absolute position of the sample stage 2 with high reliability. Furthermore, the encoder 20 can detect the position of the sample stage 2 with high resolution. Therefore, with this detector apparatus, the position of the sample stage 2 can be detected with high resolution and also with high reliability.

Furthermore, in this detector apparatus, if supply of electric power to the apparatus is interrupted and information about the current position of the sample stage 2 is lost, for example, the information about the current position of the sample stage 2 can be easily obtained upon resumption of the power supply.

In a charged particle beam system including such a detector apparatus, the position of the sample stage 2 can be detected with high resolution and also with high reliability. Accordingly, in this charged particle beam system, the sample stage 2 can be moved accurately.

It is to be understood that the above-described embodiments and modification are merely exemplary and that the invention is not restricted thereto. For example, the embodiments and modification may be appropriately combined.

The present invention embraces configurations substantially identical (e.g., in function, method, and results or in purpose and advantageous effects) with the configurations described in any one of the embodiments of the invention. Furthermore, the invention embraces configurations described in the embodiments and including portions which have non-essential portions replaced. In addition, the invention embraces configurations which produce the same advantageous effects as those produced by the configurations described in the embodiments or which can achieve the same objects as the configurations described in the embodiments. Further, the invention embraces configurations which are similar to the configurations described in the embodiments except that well-known techniques have been added.

What is claimed is:

1. A detector apparatus comprising:
    a potentiometer for detecting the position or tilt angle of a sample stage;
    an encoder having higher resolution than the potentiometer and operative to detect the position or tilt angle of the sample stage; and
    a computing unit for calculating the position or tilt angle of the sample stage, based both on an output signal from the potentiometer and on an output signal from the encoder,
    wherein the output signal from said potentiometer varies according to the position or tilt angle of said sample stage, and
    wherein, if the output signal from the potentiometer varies, said computing unit calculates the position or tilt angle of the sample stage based on the output signal from the potentiometer and, if the output signal from the potentiometer does not vary, the computing unit calculates the position or tilt angle of the sample stage by adding an amount of movement or tilt of the sample stage calculated based on the output signal from the encoder to the position or tilt angle of the sample stage calculated based on the output signal from the potentiometer.

2. A detector apparatus as set forth in claim 1, wherein said sample stage is for use in a charged particle beam system.

3. A charged particle beam system including a detector apparatus as set forth in claim 1.

\* \* \* \* \*